(12) United States Patent
Delshadpour et al.

(10) Patent No.: US 10,910,998 B2
(45) Date of Patent: Feb. 2, 2021

(54) METHOD AND APPARATUS FOR CALIBRATION OF A BAND-PASS FILTER AND SQUELCH DETECTOR IN A FREQUENCY-SHIFT KEYING TRANSCEIVER

(71) Applicant: NXP B.V., Eindhoven (NL)

(72) Inventors: Siamak Delshadpour, Phoenix, AZ (US); Ahmad Yazdi, Chandler, AZ (US); Xueyang Geng, Chandler, AZ (US)

(73) Assignee: NXP B.V., Eindhoven (NL)

( * ) Notice: Subject to any disclaimer, the term of this patent is extended or adjusted under 35 U.S.C. 154(b) by 149 days.

(21) Appl. No.: 16/135,224

(22) Filed: Sep. 19, 2018

(65) Prior Publication Data
US 2020/0091868 A1    Mar. 19, 2020

(51) Int. Cl.
| | |
|---|---|
| *H03C 3/09* | (2006.01) |
| *H04B 1/10* | (2006.01) |
| *H03L 7/099* | (2006.01) |
| *H03L 7/089* | (2006.01) |
| *H03G 3/34* | (2006.01) |
| *H03K 5/24* | (2006.01) |
| *H03H 11/12* | (2006.01) |
| *H04B 17/11* | (2015.01) |
| *H04B 1/16* | (2006.01) |
| *H04B 17/21* | (2015.01) |
| *H04B 1/04* | (2006.01) |
| *H04B 1/405* | (2015.01) |

(52) U.S. Cl.
CPC ............ *H03C 3/0991* (2013.01); *H03G 3/344* (2013.01); *H03H 11/126* (2013.01); *H03K 5/249* (2013.01); *H03L 7/0891* (2013.01); *H03L 7/099* (2013.01); *H04B 1/04* (2013.01); *H04B 1/1018* (2013.01); *H04B 1/1027* (2013.01); *H04B 1/163* (2013.01); *H04B 17/11* (2015.01); *H04B 17/21* (2015.01); *H03H 2210/012* (2013.01); *H03H 2210/04* (2013.01); *H04B 1/405* (2013.01)

(58) Field of Classification Search
CPC .. H03C 3/0991; H03C 3/0966; H03C 3/0916; H04B 1/1027; H04B 1/405; H04B 1/163; H04B 17/11; H04B 17/21; H04B 1/04; H04B 1/1018; H03L 7/099; H03L 7/0891; H03L 7/087; H03L 7/0896; H03G 3/344; H03G 3/341; H03K 5/249; H03H 2210/012; H03H 2210/04; H03H 11/126
USPC ......... 375/320, 303, 334; 327/117; 332/100, 332/117; 455/323
See application file for complete search history.

(56) References Cited

U.S. PATENT DOCUMENTS

| | | |
|---|---|---|
| 7,257,505 B1 | 8/2007 | Kurylak et al. |
| 7,495,520 B2 * | 2/2009 | Mellot .................. G06F 1/0321 332/100 |

(Continued)

*Primary Examiner* — Arnold M Kinkead

(57) ABSTRACT

Various embodiments relate to a method for calibration of a center frequency of a BPF in an FSK transceiver, the method including the steps of filtering a carrier frequency signal by the BPF to produce a filtered signal, detecting, by a phase-frequency detector ("PFD"), a difference in phase between the carrier frequency signal and the filtered signal from the BPF, sweeping a calibration code of the BPF, detecting a transition in the sign of the phase difference and capturing a calibration code associated with the transition in the sign of the phase difference for calibration of the BPF.

24 Claims, 6 Drawing Sheets

(56) References Cited

U.S. PATENT DOCUMENTS

2005/0175136 A1\* 8/2005 Wu ............................ H03J 3/08
                                                                                             375/376
2006/0267698 A1   11/2006  Erdogan et al.
2007/0207760 A1    9/2007  Kavadias et al.

\* cited by examiner

METHOD AND APPARATUS FOR CALIBRATION OF A BAND-PASS FILTER AND SQUELCH DETECTOR IN A FREQUENCY-SHIFT KEYING TRANSCEIVER

TECHNICAL FIELD

This disclosure relates generally to calibration of filters and squelch detection, and more specifically, but not exclusively, to calibration of receiver and transmitter filters of a PLL based frequency-shift keying transceiver and squelch detection.

BACKGROUND

Most transceivers require filters for the receiver and the transmitter. The receiver filter removes incoming noise and harmonics to provide a clean signal for further processing. The transmitter filter removes harmonics from the previous stage, depending on the application, for example, removing harmonics of digital to analog conversion or a modulator.

Low pass or high pass filters may have varying corner frequencies because of mismatch and process variation. For a Base Pass Filter ("BPF"), the center frequency (also high or low pass frequency) may change by process variation.

For an active resistor-capacitor ("RC") filter, corner or center frequency is proportional to 1/RC, where either the resistor or the capacitor may need to be adjusted to compensate for process variation.

For a filter calibration, keeping 1/RC constant is required to keep the RC filter response and phase shape close to the designed version to ensure system performance (i.e., removal of noise and harmonics).

Filter calibration may be performed on-chip or off chip and different methods may be used for filter calibration, however, these different methods require extra circuitry which creates more risk, complexity and takes more die area.

SUMMARY OF EXEMPLARY EMBODIMENTS

A brief summary of various embodiments is presented below. Embodiments address the need to create a method for calibration of receiver and transmitter filters of a FSK transceiver and a squelch detector.

In order to overcome these and other shortcomings of the prior art and in light of the need to create a method for calibration of receiver and transmitter filters of a FSK transceiver and a squelch detector, a brief summary of various exemplary embodiments is presented. Some simplifications and omissions may be made in the following summary, which is intended to highlight and introduce some aspects of the various exemplary embodiments, but not to limit the scope of the invention.

Detailed descriptions of a preferred exemplary embodiment adequate to allow those of ordinary skill in the art to make and use the inventive concepts will follow in later sections.

Various embodiments relate to a method for calibration of a center frequency of a band-pass filter ("BPF") in an frequency shift keying ("FSK") transceiver, the method including the steps of filtering a carrier frequency signal by the BPF to produce a filtered signal, detecting, by a phase-frequency detector ("PFD"), a difference in phase between the carrier frequency signal and the filtered signal from the BPF, sweeping a calibration code of the BPF, detecting a transition in the sign of the phase difference and capturing a calibration code associated with the transition in the sign of the phase difference for calibration of the BPF.

In an embodiment of the present disclosure, the method for calibration of a center frequency of a BPF in a FSK transceiver, the method further including receiving, by a comparator, a signal from the BPF and selecting, by a multiplexer, to receive a carrier frequency signal and transmitting the carrier frequency signal to a phase-frequency detector ("PFD").

In an embodiment of the present disclosure, the method for calibration of a center frequency of a BPF in a FSK transceiver, the method further including comparing, by the comparator, the signal from the BPF to a voltage threshold signal.

In an embodiment of the present disclosure, the method for calibration of a center frequency of a BPF in a FSK transceiver, the method further including selecting, by the multiplexer, to receive a signal from a voltage controlled oscillator ("VCO") in a phase locked loop ("PLL") during a normal operation of the FSK transceiver.

In an embodiment of the present disclosure, during the phase locked loop, the signal passes from the PFD to a charge pump, a PLL filter and the VCO.

In an embodiment of the present disclosure, an auxiliary path which determines the calibration code for calibration of the BPF includes a charge pump.

In an embodiment of the present disclosure, a first switch is closed and a second switch is open during calibration operation and the second switch is closed and a first switch is open during a normal operation.

In an embodiment of the present disclosure, the normal operation is the PLL being closed and the calibration operation is the PLL being open.

In an embodiment of the present disclosure, the comparator changes the signal from the BPF to CMOS level before being input into the PFD.

In an embodiment of the present disclosure, the calibration code corresponds to the output phase of the BPF and is stored in an integrated memory.

In an embodiment of the present disclosure, the method for calibration of a center frequency of a band-pass filter ("BPF") in an frequency shift keying ("FSK") transceiver, the method further including calibrating a squelch detector threshold in the FSK transceiver, by receiving, by a squelch detector, the squelch detector threshold, receiving, by the squelch detector, a signal from the BPF, sweeping the squelch detector threshold from a maximum value towards a minimum value, comparing, by the squelch detector, the squelch detector threshold to the signal from the BPF and capturing a calibration code for the squelch detector threshold when the signal from the BPF exceeds the squelch detector threshold.

Various embodiments relate to a method for calibration of a squelch detector threshold in a FSK transceiver, the method including the steps of receiving, by a squelch detector, the squelch detector threshold, receiving, by the squelch detector, a signal from the BPF, sweeping the squelch detector threshold from a maximum value towards a minimum value, comparing, by the squelch detector, the squelch detector threshold to the signal from the BPF and capturing a calibration code for the squelch detector threshold to a digital controller when the signal from the BPF exceeds the squelch detector threshold.

Various embodiments relate to a FSK transceiver including a BPF configured to calibrate a center frequency of the BPF, the FSK transceiver including the BPF configured to filter a carrier frequency signal to produce a filtered signal, a PFD configured to detect a difference in phase between the carrier frequency signal and the filtered signal from the BPF, the BPF configured to sweep a calibration code, the BPF configured to detect a transition in the sign of the phase difference and the BPF configured to capture a calibration code associated with the transition in the sign of the phase difference for calibration of the BPF.

In an embodiment of the present disclosure, the FSK transceiver includes a comparator configured to receive a signal from the BPF and a multiplexer configured to select to receive a carrier frequency signal and transmit the carrier frequency signal to a phase-frequency detector ("PFD").

In an embodiment of the present disclosure, the FSK transceiver includes the comparator configured to compare the signal from the BPF to a voltage threshold signal.

In an embodiment of the present disclosure, the FSK transceiver includes the multiplexer configured select to receive a signal from a voltage controlled oscillator ("VCO") in a phase locked loop ("PLL") during a normal operation of the FSK transceiver.

In an embodiment of the present disclosure, during the phase locked loop, the signal passes from the PFD to a charge pump, a PLL filter and the VCO.

In an embodiment of the present disclosure, an auxiliary path which determines the calibration code for calibration of the BPF includes a charge pump.

In an embodiment of the present disclosure, a first switch is closed and a second switch is open during calibration operation and the second switch is closed and a first switch is open during a normal operation.

In an embodiment of the present disclosure, the normal operation is the PLL being closed and the calibration operation is the PLL being open.

In an embodiment of the present disclosure, the comparator changes the signal from the BPF to CMOS level before being input into the PFD.

In an embodiment of the present disclosure, the calibration code corresponds to the output phase of the BPF and is stored in an integrated memory.

In an embodiment of the present disclosure, the FSK transceiver including a BPF configured to calibrate a center frequency of the BPF, the FSK transceiver further including the FSK transceiver configured to calibrate a squelch detector threshold, by receiving, by a squelch detector, the squelch detector threshold, receiving, by the squelch detector, a signal from the BPF, sweeping the squelch detector threshold from a maximum value towards a minimum value, comparing, by the squelch detector, the squelch detector threshold to the signal from the BPF and capturing a calibration code for the squelch detector threshold when the signal from the BPF exceeds the squelch detector threshold.

Various embodiments relate to a FSK transceiver configured to calibrate a squelch detector threshold, the FSK transceiver including a squelch detector configured to receive the squelch detector threshold, the squelch detector configured to receive a signal from the BPF, the squelch detector configured to sweep the squelch detector threshold from a maximum value towards a minimum value, the squelch detector configured to compare the squelch detector threshold to the signal from the BPF and a digital controller configured to capture a calibration code for the squelch detector threshold when the signal from the BPF exceeds the squelch detector threshold.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

These and other more detailed and specific features are more fully disclosed in the following specification, reference being had to the accompanying drawings, in which.

DETAILED DESCRIPTION OF THE INVENTION

Figure 1:
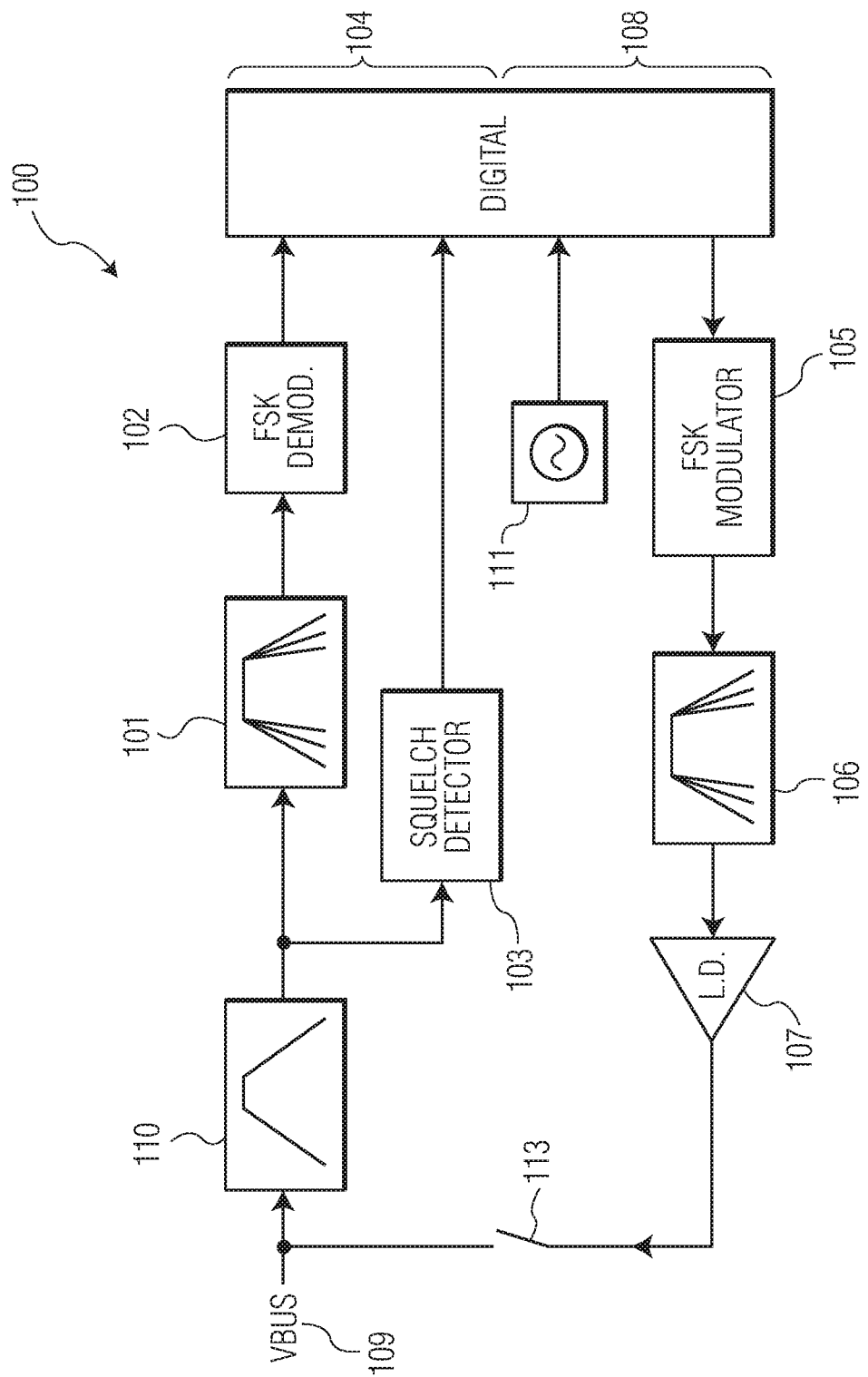
FIG. 1 illustrates a block diagram of a Universal Serial Bus ("USB") power delivery FSK transceiver with squelch detector.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable.

Traditionally, BPFs of a frequency shift keying (FSK) transceiver have been calibrated using additional circuitry in a FSK transceiver. However, in the method of the current embodiment, the method uses the existing circuitry to calibrate the filters of the FSK transceiver and as a result, no additional circuitry is needed for the calibration technique.

The method of the current embodiment breaks the PLL loop and uses the Phase Frequency Detector ("PFD") and charge pump of the PLL to adjust the filter center frequency.

The method of the current embodiment also includes squelch detector calibration, where all gain variation, offset and mismatches of components are absorbed in the squelch detection threshold level which only requires a single calibration.

The current embodiment addresses a method for calibration of the receiver and transmitter filters of a FSK transceiver.

The method of calibration may be performed in the same form as calibration by TESTER, which is an on-chip algorithm controlled by the digital controller, however, the current embodiment can also perform the same calibration without the need of a TESTER or a combination of them.

The current embodiment includes a filter calibration technique which uses the integrated PLL based FSK modulator for the calibration by breaking the PLL loop and using the auxiliary charge pump and integrated slicer for calibration. The PLL is used to demodulate the FSK signal.

A signal which has a frequency that is equal to the FSK carrier frequency (through TESTER or by the digital controller) may be applied to the first input of PFD. The signal may then pass through the BPF, which may have an order between 6 and 8, and output of BPF will be applied to the second input of PFD. Therefore, the phase of the signal at the BPF output is zero when BPF center frequency is equal to carrier frequency.

The filter calibration code may be swept from minimum (e.g., "00000") to maximum (e.g., "11111"). Output phase of BPF input phase wrt reference signal will change from negative to positive which allows the output phase from the output to go from low to high and the calibration code will be captured.

For the squelch detector calibration, the squelch detector threshold level may be calibrated after the BPF calibration, where all gain variation, offset and mismatches of components are absorbed in the squelch detection threshold level which only requires a single calibration.

While the method of the current embodiment is directed towards an active RC filter, the method can be applied to any filter type, including transconductor-C ("gm-C") or Metal-Oxide Semiconductor Field Effect Transistor-C ("MOSFET-C").

The method of the current embodiment does not need any additional circuitry for calibration of the BPF and the squelch detector as it uses already existing circuit components for calibration.

FSK demodulators may be implemented using different methods, for example, injection locked techniques to achieve gigabits data range or PLL based with high efficiency rectifier or using mixers and envelop detectors or being fully digital.

The method of the current embodiment is directed towards a receiver with a PLL based FSK demodulator and after BPF calibration, and a method is used for squelch detector calibration by adjusting squelch detection threshold level.

The BPF calibration is a low risk and low complexity BPF calibration, and in comparison to other calibration techniques, there is no additional circuitry needed which results in less complexity and no extra die are required, and the method is performed by breaking the existing PLL loop, which is acting as FSK demodulator, loop and using the phase difference for calibration. Calibration of the squelch detector requires absorbing gain variation of the filter, offset and mismatches of components in the squelch detector comparator threshold level.

FIG. 1 illustrates a block diagram of a Universal Serial Bus ("USB") power delivery FSK transceiver 100 with squelch detector.

The FSK transceiver 100 includes a receiver BPF 101, a FSK demodulator 102 and a squelch detector 103 on the receiver side 104 and a FSK modulator 105, a BPF 106, a line driver 107 and a voltage controlled oscillator ("VCO") on the transmitter side 108.

The transmitter side 108 and the receiver side 104 may communicate through one line, for example, a USB PD Virtual Bus ("VBUS") 109 or a different line depending on the application. Further, the squelch detector 103 which is a comparator uses a low pass filter 110, however, the receiver side 104 uses the higher order filter, specifically, the BPF 101. The squelch detector compares the signal with the reference signal and when the signal level is above a threshold, which is the reference signal, the squelch detector converts the signal to a sequence of 0 and 1 and transmits the signal to the digital controller 112. The digital controller 112 will process the signal and enable the FSK demodulator 102.

The digital controller 112 will send a sequence of 0's and 1's to the FSK modulator 105 to convert the sequence of 0's and 1's to a FSK signal. The signal is then passed through a BPF 106 and a line driver 107. The switch 113 is open when in transmit mode and closed when in receive mode.

The receiver side 104 BPF 101 is needed to suppress receiver side 104 noise and the transmitter side 108 BPF 106 is needed to meet the transmitter side 108 spectrum mask and due to process variation and component mismatches, the center frequency of the BPF 101 may shift which requires calibration.

Figure 2A:
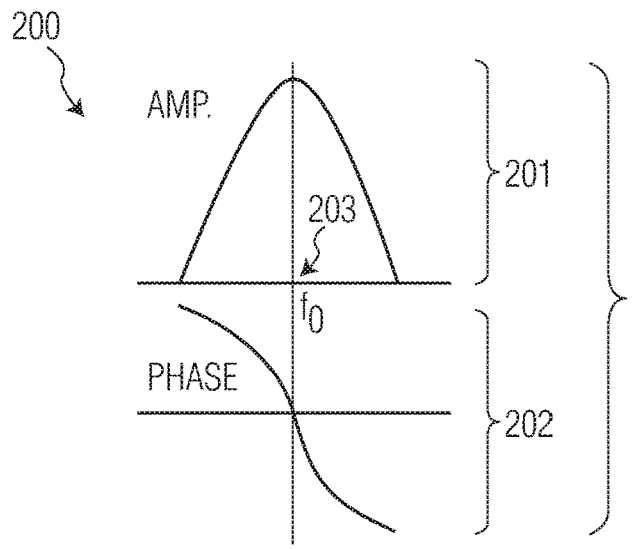
FIG. 2 includes FIG. 2A which illustrates a graph of amplitude and phase of a BPF, FIG. 2B which illustrates a graph of shifting the calibration codes of the BPF and the effect on the phase
FIG. 2C illustrates a graph of time domain behavior of an under calibrated BPF and an over calibrated BPF.
Figure 2B:
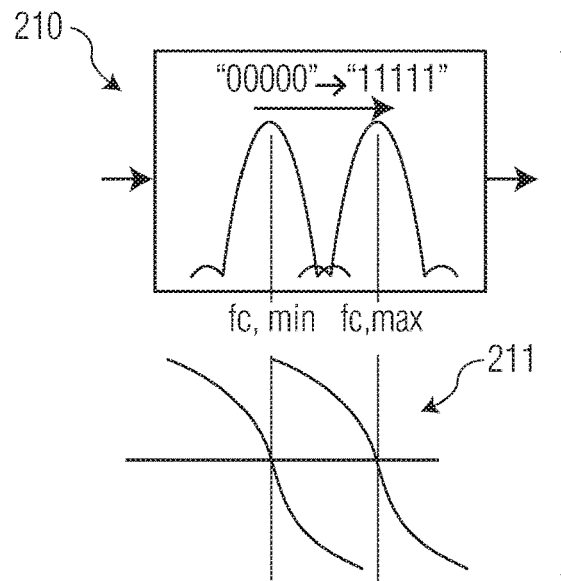
Figure 2C:
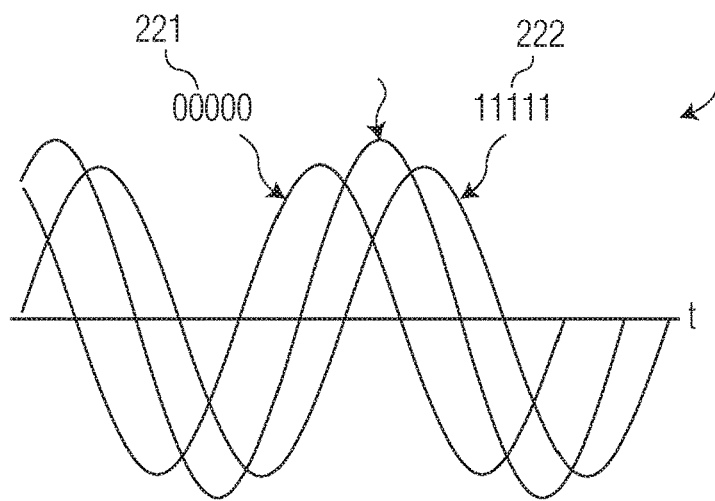

FIG. 2 includes FIG. 2A, FIG. 2B and FIG. 2C. FIG. 2A illustrates a graph 200 of amplitude and phase of a BPF. The graph 200 illustrates the amplitude 201 and phase 202 of a Biquad BPF. The phase 202 is positive before the center frequency 203 (i.e, $f < f_0$) and the phase 202 is negative after the center frequency 203 (i.e., $f > f_0$). The phase of any higher order BPF has similar behavior around the BPF center frequency, however, the phase behaves in a more complex way for out of band frequencies.

The transfer function of a Biquad BPF filter is:

$H(s) = (a1 * s * b1)/(S^2 + a2 * S + b2)$, where at the center frequency 203, $f_0$, amplitude of the signal is at a maximum value and the output phase is zero.

Depending on the architecture of the BPF filter, the center frequency 203 may be proportional to $1/(RC)$ (or $1/(C^a * R^b)$, where a and b may be integers or fractional numbers).

However, for center frequency 203, $f_0$ calibration, $R*C$=constant and any variation in the resistor or capacitor will be compensated by either a weighted capacitor or a resistor variation.

Depending on the required accuracy, the number of bits are chosen for filter calibration. For example, in the current embodiment, 5-bit was chosen for the implemented application.

FIG. 2B which illustrates a graph 210 of shifting of the BPF for different values of the calibration codes and a graph 211 showing the effect of the calibration codes on the phase.

As shown on the graph 210, changing the BPF calibration codes from "00000" to "11111" shifts the BPF filter center frequency from $f_c$, min to $f_c$, max.

FIG. 2C illustrates a graph 220 of time domain behavior of an under calibrated BPF and an over calibrated BPF.

The graph 220 shows the time domain behavior of an under calibrated 221 BPF filter, which is a signal with lag and an over calibrated 222 BPF filter, which is a signal with lead. Amplitude degradation may occur when the signal is at the edges of BPF and not at the center frequency.

Figure 3:
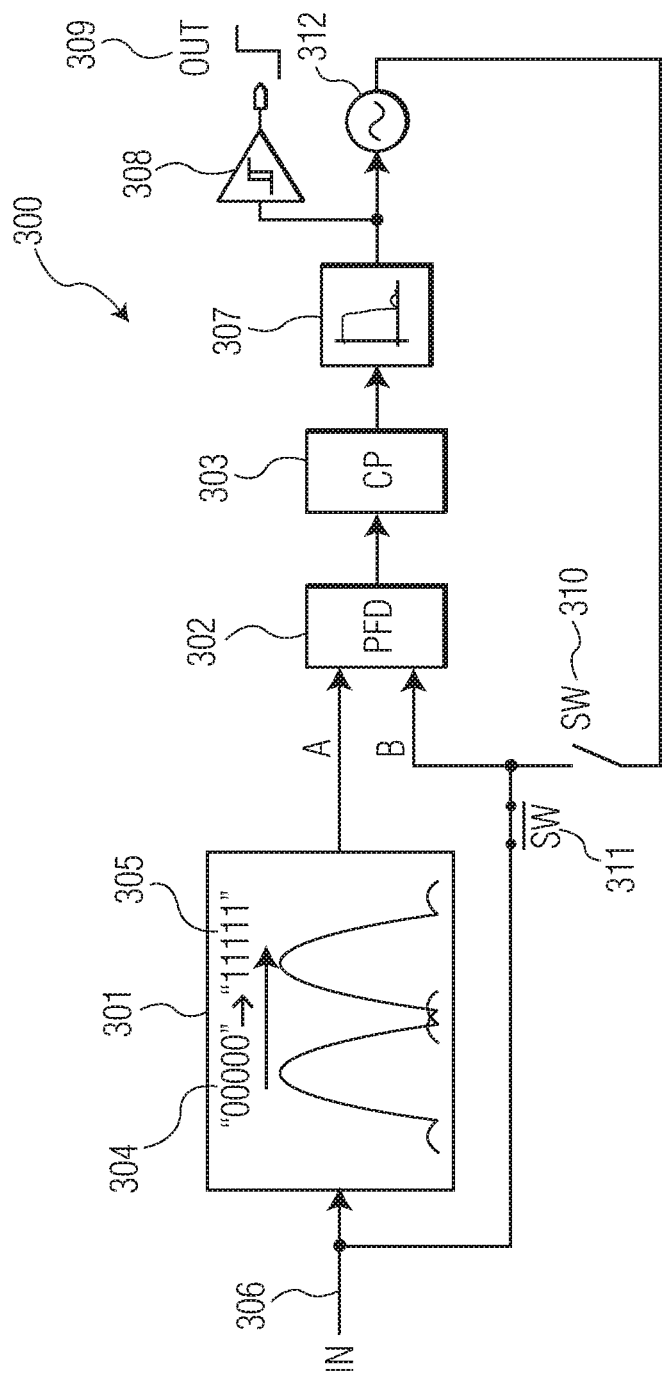
FIG. 3 illustrates a flow diagram for using a Phase Locked Loop ("PLL") to calibrate a BPF.

FIG. 3 illustrates a flow diagram 300 for using a Phase Locked Loop ("PLL") to calibrate a BPF.

FIG. 3 illustrates the calibration of a BPF 301 using a PFD 302 and charge pump 303. By sweeping the calibration code from minimum, which is "00000" 304 to a maximum, which is "11111" 305, the BPF 301 output phase is shifted from a lagging position to a leading position, with respect to the input signal 306. The PFD 302 detects the phase difference between the two input signals.

By shifting the BFP 301 output phase, the PFD 302 up and down outputs may change which will be accumulated at the output of charge pump 303 and PLL loop filter 307 may show a voltage difference, from $f_0-\Delta$ to $f_0+\Delta$, where $\Delta$ is the accuracy of calibration. The output of the PLL loop filter is also connected to a voltage controlled oscillator 312 for normal operation of the PLL.

The comparator 308 may detect the change in the voltage difference and the output 309 of the comparator 308 may be in form of a transition from low to high, at which point the captured code is the accurate code for BPF 301 filter calibration. This corresponds to the phase difference changing sign, i.e., going from negative to positive as the phase difference crosses the zero value.

The input signal 306 may be applied either externally by tester on-chip algorithm or internally, directly by the digital controller (also through a loop back in from an FSK transmitter output to FSK receiver input).

During a normal operation, the switch 310 is closed, meaning that the PLL 307 loop is closed and there is no direct path from input of filter to input of PFD and the switch 310 is open during calibration mode. The switch 311 is closed during calibration mode.

If the captured code is stored in an integrated memory, for example, one-time programmable memory ("OTP") or multi-time programmable memory ("MTP"). However, if no memory is available, the digital controller may run the algorithm when the chip powers up and save the captured code inside flip-flops or other temporary storage.

Figure 4:
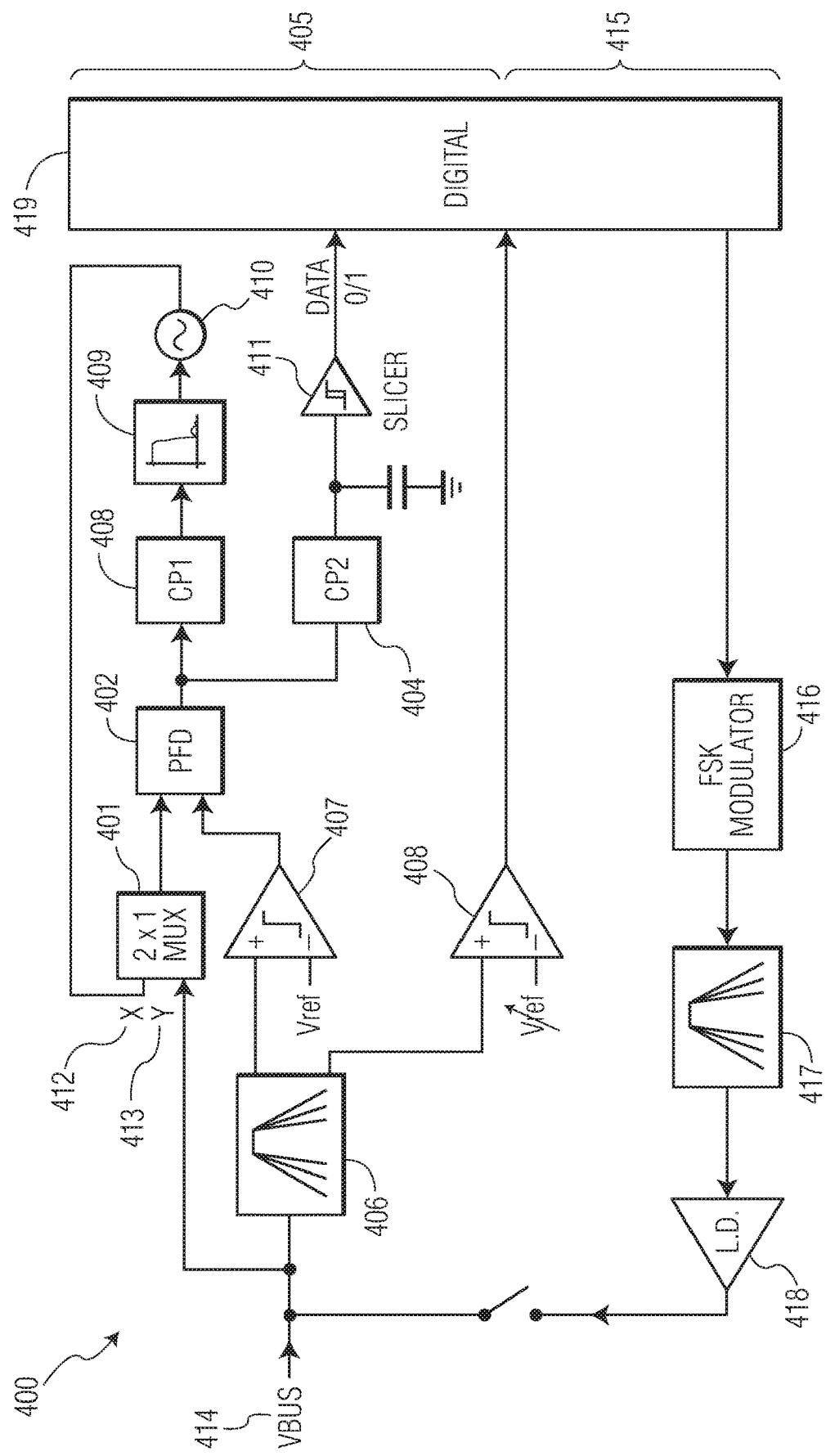
FIG. 4 illustrates a block diagram of a FSK transceiver with a PLL demodulator; and a squelch detector

FIG. 4 illustrates a block diagram of a FSK transceiver 400 with a PLL demodulator and squelch detector. The concept in the current embodiment of the calibration method may be implemented on the FSK transceiver 400 with PLL based FSK demodulator. The FSK transceiver on the receiver side 405 includes the PLL based FSK demodulator includes a 2×1 multiplexer 401, a comparator 407, a phase-frequency detector 402, a charge pump 403, a charge pump 404, a PLL loop filter 409, a voltage controlled oscillator 410 and a slicer 411. The receiver side of the PLL based FSK demodulator further includes a BPF 406 and a squelch detector 408.

The path which is formed by the charge pump 404 and the slicer 411 on the receiver side 405 of the PLL based FSK demodulator is formed to obtain a low noise low bit error rate ("BER") PLL based FSK demodulator.

The comparator 407 receives the BPF 406 output signal and a voltage reference signal and changes the BPF 406 output signal to CMOS level and inputs the changed signal into the PFD 402.

The 2×1 multiplexer 401 selects X 412 which is the PLL loop closed, in a normal Transceiver operation, and the 2×1 multiplexer 401 selects Y 412 which breaks the PLL loop, during calibration mode, which applies the input signal, VBUS 414 to the PFD 402.

The transmitter side 415 of the FSK transceiver includes a FSK demodulator 416, a BPF 417 and a line driver 418.

The squelch detector 408 performs threshold calibration by receiving a voltage reference, $V_{ref}$, which is the threshold of the squelch detector 408 is calibrated after the filter center frequency is calibrated.

For example, a signal at the squelch level which needs to be detected (e.g., 45 mV for USB PD FSK standard) with a frequency off, (i.e., carrier frequency of the FSK signal) is applied to the input of the receiver, VBUS 414. The voltage reference, $V_{ref}$ is swept from a maximum value to the point that is equal to the incoming signal level from VBUS 414, which causes the squelch detector 408 to start sending 0/1 sequence to the digital controller 419 and that code is captured as the voltage reference, $V_{ref}$ calibration code.

The voltage reference, $V_{ref}$ calibration code compensates for all gains, offsets, component mismatches of the input signal which is received by the squelch detector 408.

Figure 5:
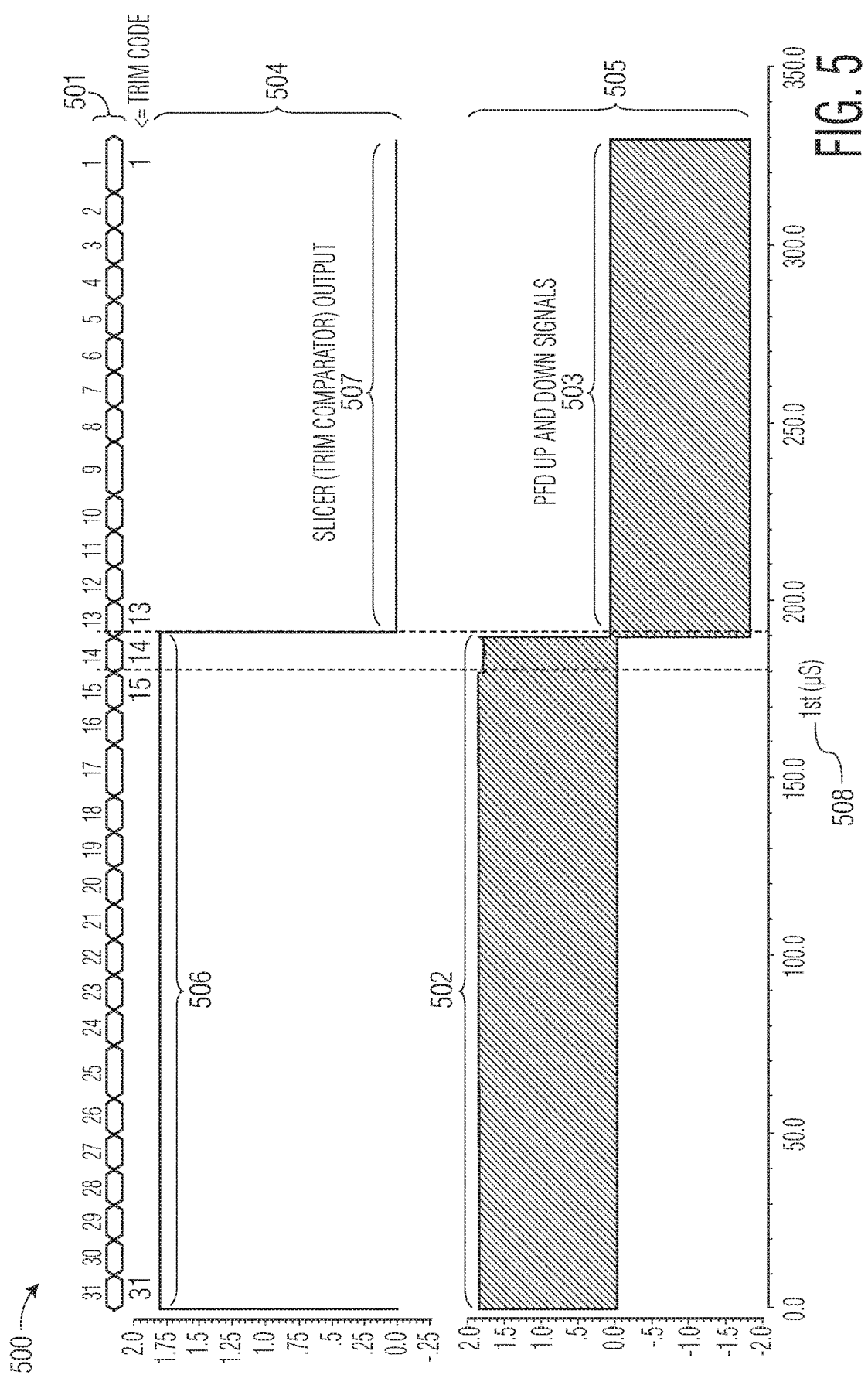
FIG. 5 illustrates a graph with a calibration code of a filter changing from 00000 to 11111, PFD up and down signals and a slicer output signal.

FIG. 5 illustrates a graph 500 with a calibration code. The graph 500 includes a graph for the output of the slicer (trim comparator) 504 and a graph for the PFD up and down signals 505. As illustrated in graph 505, as time (x-axis) 508 increases, the calibration codes are being swept and the PFD signal remains up 502 until approximately trim code 14 where the PFD signal falls down 503. This indicates that the calibration code is correct as the PFD does not detect any phase difference between the carrier frequency signal and the signal from the BPF.

As illustrated in graph 504 of the slicer output, the slicer remains up 506 until approximately trim code 14 where the slicer outputs falls down 507 and the calibration code from the slicer is used for the calibration of the BPF.

Figure 6:
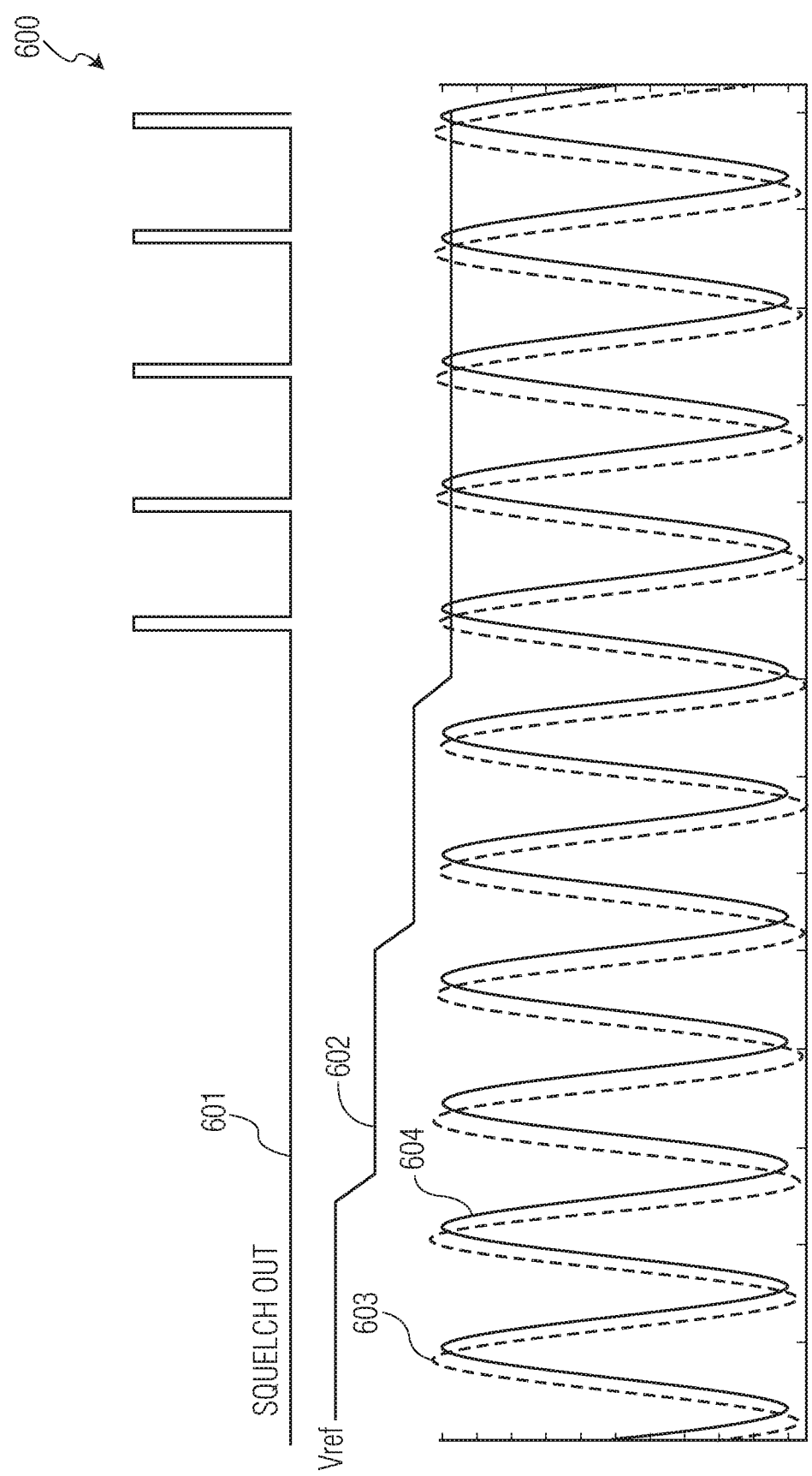
FIG. 6 illustrates a graph for the applied signal to the receiver input, the signal that the squelch comparator receives, the signal for the squelch detector comparator reference with changing squelch threshold calibration code and the signal for the squelch detector comparator output.

FIG. 6 illustrates a graph 600 for the applied signal to the input, the signal that the squelch comparator receives, the signal for the squelch detector comparator reference with changing calibration code and the signal for the squelch detector comparator.

The applied signal to the input, VBUS 603 is the signal which is input into the FSK transceiver. The signal which the squelch detector receives 604 is the signal which is output from the BPF and received by the squelch detector. The signal for the squelch detector reference which includes the changing calibration code 602 is $V_{ref}$. The signal which is output from the squelch detector 601 is the signal which is transmitted from the squelch detector to the digital controller.

The calibration method may be used for any FSK receiver (or FSK transceiver) which is using a BPF, however, depending on the type of filter, the algorithm may be different. Further, calibration of the squelch detection threshold may be used for any type of squelch detector calibration.

In the current embodiment, using an auxiliary charge pump and a slicer, no extra circuitry (with the exception of a 2×1 multiplexer) is needed. However, when using a PLL without an auxiliary path, a comparator may be used before the VCO which may perform the calibration.

It should be apparent from the foregoing description that various exemplary embodiments of the invention may be implemented in hardware. Furthermore, various exemplary embodiments may be implemented as instructions stored on a non-transitory machine-readable storage medium, such as a volatile or non-volatile memory, which may be read and executed by at least one processor to perform the operations described in detail herein. A non-transitory machine-readable storage medium may include any mechanism for storing information in a form readable by a machine, such as a personal or laptop computer, a server, or other computing device. Thus, a non-transitory machine-readable storage medium may include read-only memory (ROM), random-access memory (RAM), magnetic disk storage media, optical storage media, flash-memory devices, and similar storage media and excludes transitory signals.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Accordingly, it is to be understood that the above description is intended to be illustrative and not restrictive. Many embodiments and applications other than the examples provided would be apparent upon reading the above description. The scope should be determined, not with reference to the above description or Abstract below, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method for calibration of a center frequency of a band-pass filter ("BPF") in an frequency shift keying ("FSK") transceiver, the method comprising the steps of:
   filtering a carrier frequency signal by the BPF to produce a filtered signal;
   detecting, by a phase-frequency detector ("PFD"), a difference in phase between the carrier frequency signal and the filtered signal from the BPF;
   sweeping a calibration code of the BPF;
   detecting a transition in the sign of the phase difference;
   capturing a calibration code associated with the transition in the sign of the phase difference for calibration of the BPF; and
   closing a first switch that bypasses the BFP to provide the carrier frequency signal to the PFD during calibration operation and opening the first switch after the calibration operation.

2. The method for calibration of a center frequency of a BPF in a FSK transceiver of claim 1, the method further comprising:
   receiving, by a comparator, the filtered signal from the BPF; and
   selecting, by a multiplexer, to receive the carrier frequency signal and transmitting the carrier frequency signal to the PFD.

3. The method for calibration of a center frequency of a BPF in a FSK transceiver of claim 2, the method further comprising:
   comparing, by the comparator, the filtered signal from the BPF to a voltage threshold signal.

4. The method for calibration of a center frequency of a BPF in a FSK transceiver of claim 2, the method further comprising:
   selecting, by the multiplexer, to receive a signal from a voltage controlled oscillator ("VCO") in a phase locked loop ("PLL") during a normal operation of the FSK transceiver.

5. The method for calibration of a center frequency of a BPF in a FSK transceiver of claim 3,
   wherein during the phase locked loop, the signal passes from the PFD to a charge pump, a PLL filter and the VCO.

6. The method for calibration of a center frequency of a BPF in a FSK transceiver of claim 1,
   wherein an auxiliary path which determines the calibration code for calibration of the BPF includes a charge pump.

7. The method for calibration of a center frequency of a BPF in a FSK transceiver of claim 1,
   wherein the first switch is closed and a second switch is open during calibration operation and the second switch is closed and the first switch is open during a normal operation.

8. The method for calibration of a center frequency of a PBF in a FSK transceiver of claim 4,
   wherein the normal operation is the PLL being closed and the calibration operation is the PLL being open.

9. The method for calibration of a center frequency of a BPF in a FSK transceiver of claim 2,
   wherein the comparator changes the signal from the BPF to CMOS level before being input into the PFD.

10. The method for calibration of a center frequency of a BPF in a FSK transceiver of claim 1,
    wherein the calibration code corresponds to an output phase of the BPF and is stored in an integrated memory.

11. The method for calibration of a center frequency of a band-pass filter ("BPF") in an frequency shift keying ("FSK") transceiver of claim 1, the method further comprising:
    calibrating a squelch detector threshold in the FSK transceiver, by:

receiving, by a squelch detector, the squelch detector threshold;

receiving, by the squelch detector, a signal from the BPF;

sweeping the squelch detector threshold from a maximum value towards a minimum value;

comparing, by the squelch detector, the squelch detector threshold to the signal from the BPF; and capturing a calibration code for the squelch detector threshold when the signal from the BPF exceeds the squelch detector threshold.

12. A frequency shift keying ("FSK") transceiver, the FSK transceiver comprising:

a BPF configured to:
  filter a carrier frequency signal to produce a filtered signal;
  sweep a calibration code;
  detect a transition in a sign of a phase difference; and
  capture a calibration code associated with the transition in the sign of the phase difference for calibration of the BPF; and
a phase-frequency detector ("PFD") configured to detect a difference in phase between the carrier frequency signal and the filtered signal from the BPF.

13. The FSK transceiver of claim 12, wherein the FSK transceiver includes:
a comparator configured to receive the filtered signal from the BPF; and
a multiplexer configured to select to receive the carrier frequency signal and transmit the carrier frequency signal to the PFD.

14. The FSK transceiver of claim 12, wherein the FSK transceiver includes:
a comparator configured to compare the filtered signal from the BPF to a voltage threshold signal.

15. The FSK transceiver of claim 13,
wherein the multiplexer is further configured to select a signal from a voltage controlled oscillator ("VCO") in a phase locked loop ("PLL") during a normal operation of the FSK transceiver.

16. The FSK transceiver of claim 14,
wherein the signal passes from the PFD to a charge pump, a PLL filter and the VCO.

17. The FSK transceiver of claim 12,
wherein an auxiliary path which determines the calibration code for calibration of the BPF includes a charge pump.

18. The FSK transceiver of claim 12, further comprising:
a first switch configured to be closed during calibration operation and closed and a first switch is open during a normal operation; and
a second switch configured to be open during calibration operation and closed during a normal operation.

19. The FSK transceiver of claim 15,
wherein the normal operation is the PLL being closed and the calibration operation is the PLL being open.

20. The FSK transceiver of claim 12,
wherein a comparator changes the signal from the BPF to CMOS level before being input into the PFD.

21. The FSK transceiver of claim 12,
wherein the calibration code corresponds to an output phase of the BPF and is stored in an integrated memory.

22. The FSK transceiver of claim 12, the FSK transceiver further comprising:
a squelch detector configured to:
  receive the squelch detector threshold;
  receive a signal from the BPF;
  sweep the squelch detector threshold from a maximum value towards a minimum value; and
  compare the squelch detector threshold to the signal from the BPF; and
a digital controller configured to capture a calibration code for the squelch detector threshold when the signal from the BPF exceeds the squelch detector threshold.

23. A FSK transceiver, the FSK transceiver comprising:
a squelch detector configured to:
  receive the squelch detector threshold;
  receive a signal from the BPF;
  sweep the squelch detector threshold from a maximum value towards a minimum value; and
  compare the squelch detector threshold to the signal from the BPF; and
a digital controller configured to capture a calibration code for the squelch detector threshold when the signal from the BPF exceeds the squelch detector threshold.

24. A frequency shift keying (FSK) transceiver configured to calibrate a center frequency of a band-pass filter (BPF), comprising:
the BPF which is configured to receive a carrier frequency signal and output a filtered signal;
a switch configured to receive the carrier frequency signal and bypass the BFP;
a phase-frequency detector (PFD) configured to receive the filtered signal from the BPF and receive the carrier frequency signal from the switch;
a controller coupled to the BPF, the switch, and the PFD and configured to,
  begin calibration by closing the switch;
  receive a difference in phase between the carrier frequency signal and the filtered signal from the PFD;
  sweep a calibration code of the BPF;
  detect a transition in a sign of the difference in phase; and
  capture a calibration code associated with the transition in the sign of the difference in phase for calibration of the BPF; and
  open the switch to end calibration.

* * * * *